United States Patent [19]

Yoshikawa et al.

[11] Patent Number: 5,305,948
[45] Date of Patent: Apr. 26, 1994

[54] METHOD OF BONDING A METAL BY SOLDER

[75] Inventors: Yoshio Yoshikawa; Yoshiaki Inoue; Teruo Takeuchi; Kazuo Fujinami, all of Tokyo, Japan

[73] Assignee: Mitsubishi Gas Chemical Company, Inc., Tokyo, Japan

[21] Appl. No.: 67,599

[22] Filed: May 27, 1993

[30] Foreign Application Priority Data

Jun. 2, 1992 [JP] Japan .................... 4-141825

[51] Int. Cl.$^5$ .............. B23K 35/363; B23K 35/38; H01L 21/50; H01L 21/54
[52] U.S. Cl. .................... 228/205; 228/207; 228/217; 148/25; 29/841
[58] Field of Search ........... 228/203, 205, 207, 214, 228/217, 223; 29/841, 855; 148/25

[56] References Cited

U.S. PATENT DOCUMENTS

| | | | |
|---|---|---|---|
| 3,086,893 | 4/1963 | Konig | 148/23 |
| 3,973,322 | 8/1976 | Boynton | 228/180.1 |
| 4,908,151 | 3/1990 | Inoue et al. | |

FOREIGN PATENT DOCUMENTS

| | | | |
|---|---|---|---|
| 0155139 | 9/1985 | European Pat. Off. | |
| 0269410 | 6/1988 | European Pat. Off. | |
| 0454437 | 10/1991 | European Pat. Off. | |
| 55-048468 | 4/1980 | Japan | 228/217 |
| 62-60936 | 12/1987 | Japan | |
| 3-148471 | 6/1991 | Japan | |
| 3-148472 | 6/1991 | Japan | |
| 4-29741 | 1/1992 | Japan | |
| 4-268085 | 9/1992 | Japan | |
| 4-297588 | 10/1992 | Japan | |

OTHER PUBLICATIONS

"No-Clean Fluxes are a Viable Alternative to CFC Cleaning", Electronic Packing and Production, vol. 30, No. 6, Jun. 1990, pp. 95-98.

Primary Examiner—Samuel M. Heinrich
Attorney, Agent, or Firm—Armstrong, Westerman, Hattori, McLeland & Naughton

[57] ABSTRACT

The solder bonding is conducted by applying a postflux, which contains halogen compounds in the ratio of 0.2% or less as the amount of halogen, over a metal surface, which is the portion to be bonded by solder, of a member including metal accommodated in a gas-impermeable container in a hermetically sealed manner together with a rust-proof agent packet. The method of the present invention prevents, in an extremely simple way and at a low cost, the oxidation of the metal surface by retaining the member including the metal under a reductive atmosphere in which no oxygen, moisture or corrosive substances actually exist, and in which reductive gas co-exists with the material including the metal member, and the use of the flux containing a small amount of halogen easily enables good bonding properties of the solder. Accordingly, it is unnecessary to remove the flux by organic halogen based solvents after the solder bonding, the cleaning steps may be simplified and cost reduction may be promoted.

26 Claims, 3 Drawing Sheets

PRESERVATION PERIOD AND BONDING PROPERTIES OF SOLDER ON THE TEST PIECES GILDED WITH SOLDER

□ : EXAMPLE   + : COMPARATIVE EXAMPLE 1   ◇ : COMPARATIVE EXAMPLE 2

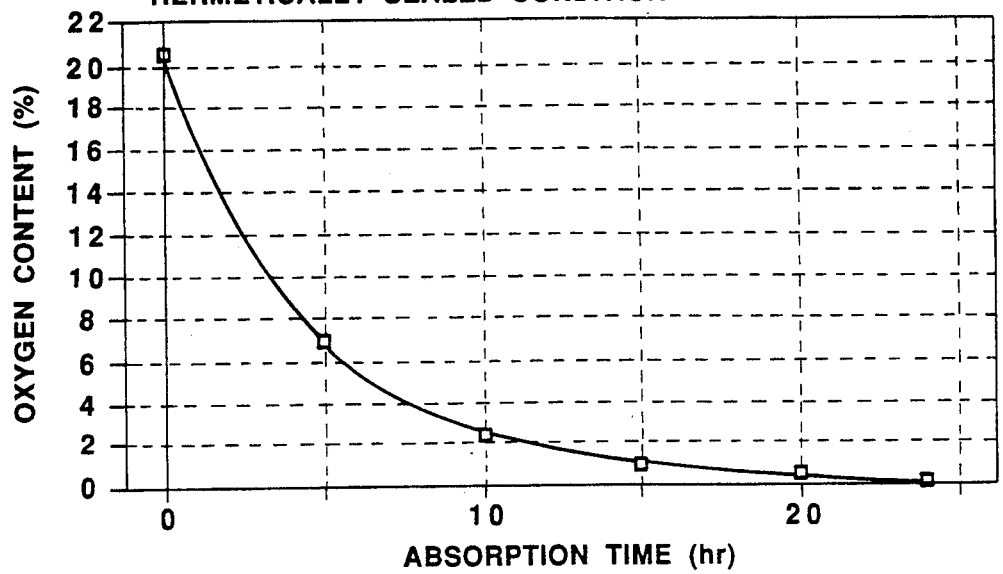
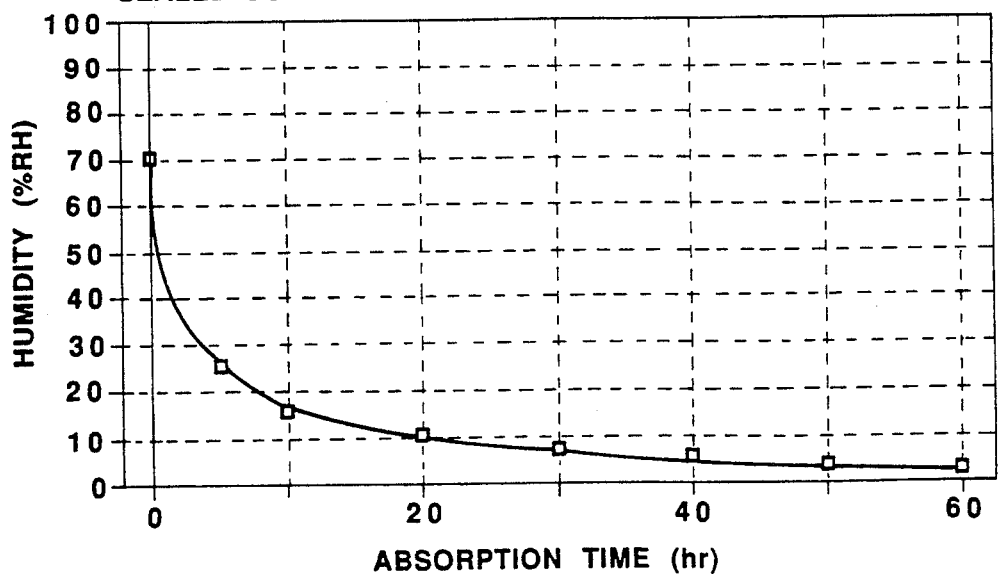

CHANGES IN THE HYDROGEN SULFIDE CONTENT OF THE RUST-PROOF AGENT PACKET WITH THE PASSAGE OF TIME IN THE HERMETICALLY SEALED CONDITION

PRESERVATION PERIOD AND BONDING PROPERTIES OF SOLDER ON THE TEST PIECES GILDED WITH COPPER

□ : EXAMPLE   + : COMPARATIVE EXAMPLE 1   ◇ : COMPARATIVE EXAMPLE 2

PRESERVATION PERIOD AND BONDING PROPERTIES OF SOLDER ON THE TEST PIECES GILDED WITH SILVER

□ : EXAMPLE   + : COMPARATIVE EXAMPLE 1   ◇ : COMPARATIVE EXAMPLE 2

PRESERVATION PERIOD AND BONDING PROPERTIES OF SOLDER ON THE TEST PIECES GILDED WITH SOLDER

□ : EXAMPLE   + : COMPARATIVE EXAMPLE 1   ◇ : COMPARATIVE EXAMPLE 2

ABSTRACT
METHOD OF BONDING A METAL BY SOLDER

BACKGROUND OF THE INVENTION

The present invention relates to a solder bonding method for metal or a member including metal, or more preferably, an electronic member. More particularly, the present invention relates to a solder bonding method which prevents metal from oxidizing during transportation or preservation and which enables the solder bonding of metal applying flux, which contains a small amount of halogen, and without cleaning.

When a member including metal is exposed to air during preservation or transportation, the metal easily oxidizes, an oxide layer forms over the metal surface, and the bonding properties of solder on the metal rapidly deteriorates. Therefore, in order to attain good bonding properties between the metal and solder by removing the oxide layer on the metal surface, flux (postflux) is applied on the portion to be bonded with the other material or member by solder bonding. However, the postflux usually contains halogen compounds, and when the postflux containing a large amount of halogen compounds is used in the solder bonding of a member having metal, especially an electronic member used in the electronic field, the remaining halogen compounds cause the corrosion of metal and lowers the electrical insulatability. Therefore, the halogen compounds remaining on the electronic member after application of solder are removed by cleaning treatment with organic halogen based solvents such as chlorofluoro hydrocarbon, chlorohydro hydrocarbon and fluoro hydrocarbon, and water containing surface active agents. However, the use of organic halogen-based solvents tends to be prohibited by international conventions in order to prevent the destruction of earth's environment such as the ozone layer, thereby limiting the applicability of flux containing a large amount of halogen compounds to the solder bonding of electronic material and/or an electronic member. Moreover, there are some problems in the water cleaning that waste water containing heavy metals and organic solvents after the water cleaning has to be treated in order not to contaminate the earth's environment with heavy metals and organic solvents and that drying after the water cleaning costs a considerable amount of money.

Because of the above-mentioned circumstances, no cleaning technology which does not require cleaning after the solder bonding when organic halogen based solvents are used has been developed by applying a postflux containing a small amount of halogen compounds (hereinafter referred to as "subvital postflux"). In this case, the amount of the remaining halogen on a substrate on which parts are mounted by solder bonding has to be restrained in the amount of 14 μg/inch² or less. It is necessary to reduce the amount of halogen contained in the subvital postflux.

Because of the weak strength of the subvital postflux to remove oxides, it is necessary to prevent the oxidation of the member including metal during preservation or transportation. Therefore, the following preservation methods are usually adopted: accommodating the metal member and a desiccant in a hermetically sealed manner; or replacing the inside of the preservation container with inert gas. However, these preservation methods have not always been satisfactory. For example, it is not easy to completely replace the air within the preservation container even by the method of replacing the inside of the container with inert gas such as nitrogen and argon. Even if the air is completely replaced, oxygen and moisture permeate through the packing material into the container during preservation, and the oxygen content and the humidity within the preservation container increase, causing the metal surface to be oxidized. In the method using desiccants, even if moisture is completely removed, the problem that oxidation of the metal occurs still remains. Moreover, the humidity rises due to moisture that permeates through the packing material with the passage of time or the moisture contained in the object to be preserved, causing oxidation of the metal surface.

In any case, it was difficult to prevent oxidation of the metal member by the conventional methods. As a result, there was a problem that the oxide layer of the metal member could not be removed by the solder bonding using the subvital postflux.

As described above, there was a problem that sufficient bonding properties could not be obtained by the conventional method of bonding metal by solder using a subvital postflux. The object of the present invention is to provide a method for enabling a good solder bonding of the metal and other material or member using a no-cleaning subvital postflux.

SUMMARY OF THE INVENTION

After concentrating their energies on study to solve the above-mentioned problems with the prior art, the inventors have found that oxidation of metal can be prevented by accommodating a member including metal and a packet packing a rust-proof agent, which absorbs substances that oxidize metal such as oxygen, moisture and acid gas, in a gas-impermeable container in a hermetically sealed manner, and that good bonding properties of solder such as bonding strength and cohesiveness may be attained applying a no-cleaning subvital postflux by removing the substances that oxidize metal within the container, and the inventors thereby achieved the present invention.

The present invention relates to a method for bonding a metal by solder. More particularly, the contents of the present invention comprise the step of accommodating a member including metal together with a packet of rust-proof agent in a gas-impermeable container in a hermetically sealed manner and the step of applying a postflux, containing halogen compounds in the amount of 0.2% or less as the amount of halogen, on the portion of the metal material to be bonded with another material and/or member including metal in order to conduct the solder bonding.

The method of the present invention inhibits the existence of oxygen, moisture and corrosive substances in the hermetically sealed condition as much as possible by preserving the metal member together with the rust-proof agent, which absorbs at least oxygen and preferably further absorbs moisture and acid gas, accommodated in the gas-impermeable container in a hermetically sealed manner. Moreover, the method of the present invention prevents formation of an oxide layer over the metal surface of the metal member by keeping an electronic material in an atmosphere where reductive gas co-exists, and enables the solder bonding of the metal material using the flux containing a small amount of halogen.

The member including metal bonded by solder in the present invention may be a simple substance or an alloy which is capable of being bonded by solder, or preferably parts including metal, or more preferably an electronic member such as electronic parts used in the electronics field. The member including metal may be a metal material itself.

As examples of metals which are to be bonded by solder, copper, silver, iron, zinc, lead, tin, nickel and gold may be listed. An alloy containing two or more kinds of these metals may be used. When oxygen exists, an oxide layer is formed on the surface of these metals, and it is assumed that the formation of the oxide layer may be promoted by the existence of moisture and corrosive substances such as sulfur compounds and halogen compounds.

As the member including metal, an electronic member is especially preferable. The electronic member including metal essentially comprises metallic and plastic materials, and the metal portions are bonded with other parts, members or materials by solder. Examples of the electronic member are electronic parts such as basic elements and wiring substrates.

As basic elements, electronic parts such as cables, resistors, capacitors, relays, semiconductor devices and wave guides may be listed. A wiring substrate is made by forming conductive metal foils into a pattern and laminating such pattern over a plastic layer. In some case, this wiring substrate is further gilded with silver, tin or solder, or is previously coated with a preflux of which the main components are rosin, polyester resin and the like. Such electronic member gilded with solder or previously coated with preflux may be preserved without any modification together with a rust-proof agent packet in a hermetically sealed manner.

A solder metal formed into powder or cream may be used. The solder cream is formed by mixing the powdery solder, the postflux and organic solvents. The grain size of the powdery solder metal is 10 to 70 $\mu$m, or preferably 10 to 50 $\mu$m.

A rust-proof agent packet is a packet packaging an oxygen absorbing agent which easily absorbs oxygen in a dry condition in a state where no water exists, i.e., an oxygen absorbing agent which does not require the existence of water in the oxygen absorption reaction, or preferably an oxygen absorbing agent capable of not only absorbing oxygen but also absorbing moisture and corrosive substances such as sulfur compounds and halogen compounds.

The rust-proof agent packet is accommodated in a preservation container together with the member including metal in a hermetically sealed manner, and it absorbs oxygen, moisture and corrosive substances within the preservation container to make the oxygen content 0.5% or less, or preferably 0.1% or less, in order to maintain an atmosphere in the hermetically sealed condition in a state where no oxygen actually exists, which inhibits the oxidation of the metal. Especially, the oxidation of the metal may be inhibited by removing moisture and corrosive substances such as sulfur compounds and halogen compounds, which are known to promote the oxidation of metals, preferably within 5 hours, and by removing these substances which permeate through the container.

If the speed of oxygen absorption by the rust-proof agent packet is slow, the metal sometimes becomes oxidized before a state of no oxygen is achieved. On the other hand, if the speed of oxygen absorption is too fast, while the rust-proof agent is exposed to the atmosphere, the loss of its oxygen absorbing capacity becomes great and the generation of heat becomes substantial due to a radical oxygen absorption reaction. Therefore, the oxygen absorption speed of the rust-proof agent, i.e., a period of time necessary for the rust-proof agent to absorb oxygen in the hermetically sealed condition until it actually achieves a state of no oxygen, is adjusted to be within a range from 2 hours to 5 days, or preferably 3 hours to 3 days, or more preferably 5 hours to 2 days.

To be specific, the rust-proof agent comprises an unsaturated fatty acid compound, or an unsaturated fatty acid compound and a hydrocarbon compound having unsaturated groups as the main component.

A rust-proof agent composite may contain at least one of an oxidation promoting substance, a basic substance and an absorption substance other than the above-mentioned main component.

The unsaturated fatty acid compound is at least one of an unsaturated fatty acid and derivatives such as an ester of the unsaturated fatty acid and a salt of the unsaturated fatty acid. The number of carbon atoms in the unsaturated fatty acid compound is preferably 10 or more. As the unsaturated fatty acid compound, at least one of oleic acid, linoleic acid, linolenic acid, arachidonic acid, parinaric acid, dimer acid, lithinolein acid, ricinoleic acid, esters thereof, fats and oils containing these esters, and metal salts should preferably be used.

The hydrocarbon compound is preferably chain hydrocarbon, which has one or more unsaturated groups such as double-bonded carbon atoms, or may be an oligomer or polymer of monomers of hydrocarbon chain, or a derivative of a hydrocarbon chain. A substituent of the derivative such as hydroxyl group and formyl group may exist. Examples of the hydrocarbon chain having unsaturated groups are oligomers or polymers of butadiene, isoprene, or 1,3-pentadiene, and squalene. The number of carbon atoms in this hydrocarbon chain is preferably 10 or more. However, contamination of impurities in the main component of the present invention cannot be avoided as long as the objective of the present invention is achieved.

A preferable example of the main component of the rust-proof agent composite is a transition metal salt of unsaturated fatty acid, or a mixture of transition metal salt of unsaturated fatty acid and unsaturated fatty acid, or more preferable mode is a mixture of such compound and hydrocarbon polymers having unsaturated groups. The prevention of the oxidation of metal is improved by the co-existence of reductive gas in the container. The above-described main component generates reductive gas such as hydrogen and carbon monoxide when the main component absorbs oxygen. When accommodating the member including metal in the gas-impermeable container together with the rust-proof agent packet, the inside of the gas-impermeable container may be previously replaced with reductive gas.

An oxidation promoting substance serves as a catalyst of an oxygen absorption reaction by the main component. Examples of the oxidation promoting substance are compounds of transition metals such as iron, cobalt, chrome, copper and nickel. As the transition metals, for example, inorganic acid salts such as sulfuric acid salt, hydrochloric acid salt and nitric acid salt, organic acid salts such as fatty acid salt and unsaturated fatty acid salt, or amine complex of transition metals are used. It is preferable to mix the oxidation promoting substance with the main component equally. As mentioned above, the oxidation promoting substance may be in the form of a metal salt of the unsaturated fatty acid used for the main component.

A basic substance absorbs or neutralizes corrosive substances such as sulfuric compounds and halogen compounds, which diffuse through the preservation container, and acid (acidic) substances which are generated by the oxygen absorption reaction of the main component such as unsaturated fatty acid compounds. There is no special limitation as to the basic substance to be used as long as the above-described purpose is achieved. As preferable basic substances, oxides, hydroxides, carbonates and organic acid salts of alkali metal or alkaline earth metal, and organic amines may be listed, and such basic substances that neutralize acid substances.

An absorption substance absorbs moisture which oxidizes metals and more preferably absorbs even acid substances. With regard to the main component such as the above-mentioned unsaturated fatty acid compound and the hydrocarbon compound, when it is held by a carrier, the area contacting oxygen extends and the speed of oxygen absorption increases. The absorption substance that also serves as such a carrier is preferable. Examples of the absorption substance are paper made of natural pulp, silica gel, activated carbon, zeolite, activated clay and diatomaceous earth.

A rust-proof agent composite contains a main component, an oxidation promoting substance, a basic substance and an absorption agent as described above. The proportion of the respective components is preferably within a range of 0.01 to 10 parts by weight of the oxidation promoting substance, 1 to 1000 parts by weight of the basic substance, and 10 to 1000 parts by weight of the absorption substance against 100 parts by weight of the main component.

Among the components of the above rust-proof agent composite, it is desirable to have the liquid substances held on the absorption substance and these substances combined. There is no limitation as to the shape of the rust-proof agent composite, and the shape may be adjusted into a grain, tablet or sheet as appropriate.

The above rust-proof agent composite is used as a packet which is wrapped with a packing material having permeability, that is, having an oxygen permeation speed of 1000 ml/m$^2$·atm·Day or more. There is no limitation as to the air-permeable packing material and composition thereof. For example, the rust-proof agent composite may be filled in a sheet of paper, non-woven cloth, porous plastic film or sheet, or a laminated material of these materials, and its peripheries are sealed by heat.

This packet may be double wrapped with a gas-permeable packing material of which the oxygen permeability is 1000 ml/m$^2$·atm·Day or more, the humidity is 1 g/m$^2$·Day or more and, when air is permeated, the collection efficiency of dust in the size of 0.3 μm or more is 50% or more.

There is no limitation as to the shape of the above-described rust-proof agent packet, but a small bag shape, a sheet shape or a blister package may be listed as examples of the shape.

As a gas-impermeable container used for the preservation of an electronic material in the present invention, a bag, case, can or the like whose material is made of gas-impermeable plastic or metal may be used. The gas-impermeable container has a speed of oxygen permeation of 5 ml/Day or less per volume of 100 ml, or preferably 1 ml/Day or less, and the speed of moisture permeation of 5 g/Day or less per volume 100 ml, or preferably 1 g/Day or less.

As examples of the gas-impermeable container, a case made of synthetic resin such as polyethylene, polypropylene, nylon, polyester, vinyl chloride, polystyrene, and polycarbonate, or a bag of laminated materials made of films or sheets of vinyl chloride, vinylidene chloride, nylon, polyethylene, polypropylene, polyester and the like may be used. When the material is a plastic film or sheet, it is preferable to deposit aluminum, silicon dioxide, selenium dioxide or the like on the surface of the plastic film or sheet in order to secure the resistance to gas permeation. Moreover, a metal foil such as an aluminum foil is sometimes used to laminate the plastic film.

Furthermore, as the gas-impermeable container, there is a metal can made of iron, tin plate, stainless or aluminum, and a plastic packing material may be used for the metal can.

In some cases, the materials used for the gas-impermeable container are treated to eliminate static electricity charges.

The solder bonding method of the present invention is performed by previously applying a subvital postflux over the metal surface of the object to be bonded and by heating and melting the solder metal. The solder metal to be used is an alloy containing tin. The ratio of tin contained is 5 to 95%. The solder metal should preferably be an alloy of tin and lead.

The subvital postflux is a solution of rosin dissolved in alcohol and also contains halogen compounds such as hydrochloride of amine and hydrogen fluoride salt. However, the amount of the halogen compounds contained in the postflux is small. The amount of the halogen compounds contained in the subvital postflux is, as the amount of halogen, 0.2% or less, or preferably 0.1% or less, or more preferably 0.05% or less.

When the solder bonding is conducted, the subvital postflux is applied over the metal surface of, for example, a wiring substrate, which is the object to be bonded by solder, by a method such as brushing, foaming or spraying, and the subvital postflux is heated and dried at a temperature of 50° C. to 300° C. In this case, the amount of the postflux applied is 10 to 1000 g/m$^2$, or preferably 15 to 800 g/m$^2$. Then, the metal to be bonded and the counter member are bonded with solder metal which is heated and melted at 200° C. to 300° C.

Alternatively, there is a bonding method using solder cream which is made by changing the powder of the solder component into a paste form and which contains subvital postflux. In this case, the solder cream is applied on a member such as a wiring substrate, is heated by infrared rays up to a temperature of 200° C. to 300° C. and is bonded.

BRIEF EXPLANATION OF THE DRAWINGS

FIG. 1 shows the changes in the oxygen content of the rust-proof agent packet (25° C.) with the passage of time in the hermetically sealed condition.

FIG. 2 shows changes in the humidity of the rust-proof agent packet (25° C.) with the passage of time in the hermetically sealed condition.

DESCRIPTION OF THE PREFERRED EMBODIMENTS

Examples of the present invention will be described hereinafter. However, the present invention is not limited to the following examples.

EXAMPLE

Preparation of Test Pieces

Copper, silver and solder metal were gilded respectively in the thickness of 5 μm on a copper plate (size: 1.27 mm width ×60 mm length×0.5 mm thickness). The gilded copper plate was cleaned in water, dipped in ethanol at a temperature of 23° C., and dried in blast at a temperature of 24° C. to prepare three kinds of test pieces gilded with copper, silver and solder.

Manufacture of Rust-Proof Agent Packet 0.2 g of cobalt naphthenate was dissolved in 1.0 g of a mixture which is comprised of 0.5 g of polybutadiene (viscosity: 200 poise) and 0.5 g of fatty acid of soy bean oil. The obtained solution was impregnated into 5 g of granular diatomaceous earth, and then the diatomaceous earth was coated with 0.1 g of slaked lime to manufacture a granular composite. This granular composite (total weight: 6.3 g) and 2.5 g of the granular calcium oxide were wrapped with an air-permeable packing material (70×70 mm), which was formed by laminating paper and a porous polyethylene film, with the polyethlene film inside. Then, the peripheries of the packing material were sealed by heat to manufacture a rust-proof agent packet.

Gas Absorptivity of Rust-Proof Agent Packet

One piece of the rust-proof agent packet was accommodated in a bag sealed on three sides (size: 220×300 mm, surface area: 0.11 m², oxygen permeation speed: 0.044 ml/24 Hr). This bag was made of a silicon dioxide deposited combined film which was formed by depositing silicon dioxide on the inside of polyethylene terephthalate and by laminating polyethylene and the polyethylene terephthalate with the polyethylene facing inside. The bag was filled with 500 ml of air (humidity: 65RH %, content of hydrogen sulfide: 7 ppm) and its opened portion was hermetically sealed by heat.

Figure 3:
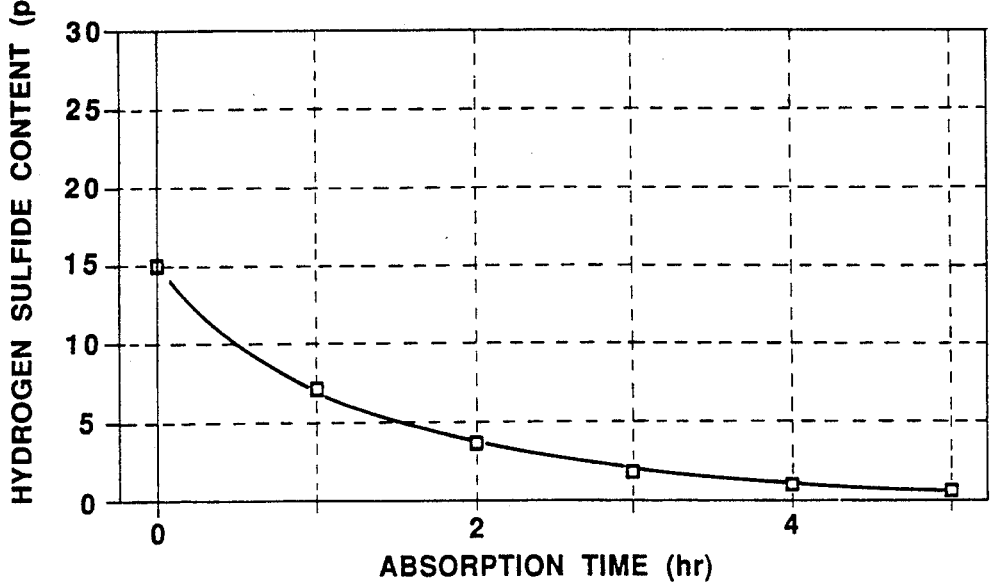
FIG. 3 shows changes in the hydrogen sulfide content of the rust-proof agent packet (25° C.) with the passage of time in the hermetically sealed condition.

FIGS. 1, 2 and 3 respectively show changes with the passage of time in the oxygen content, humidity and hydrogen sulfide content when this bag with the rust-proof agent packet accommodated inside in a hermetically sealed manner was left alone at a temperature of 25° C.

Preservation of Test Pieces

Each piece of the above-described three kinds of test pieces was accommodated in a hermetically sealed manner with 500 ml of air in the bag of the silicon dioxide deposited combined film sealed on three sides (size: 220×300 mm) which is the same as the bag described above. This bag with the test piece and the rust-proof agent packet accommodated inside in a hermetically sealed manner was once retained at a temperature of 25° C. for 1 day, and then was preserved under the atmosphere of RH95% or more at the temperature of 40° C.

Table 1 shows the oxygen content and humidity within the sealed bag under preservation and FIG. 2 shows the concentration of the reductive gas detected by gas chromatography. Table 3 shows the state of discoloration of the test pieces under preservation.

TABLE 1

Changes with the Passage of Time in the Oxygen Content and Humidity in the Preservation Condition

| | | Oxygen Content (%) | | | Humidity (RH %) | | |
|---|---|---|---|---|---|---|---|
| | Material | 1 wk. 3) | 2 wks. 4) | 1 mo. 5) | 1 wk. | 2 wks. | 1 mo. |
| Ex. 1) | copper | 0.02 | 0.02 | 0.01 | 1 | 2 | 4 |
| | silver | 0.01 | 0.02 | 0.01 | 0 | 1 | 3 |
| | solder | 0.01 | 0.01 | 0.02 | 1 | 1 | 3 |
| Com. Ex. 1 2) | copper | 20.21 | 20.46 | 20.51 | 5 | 15 | 37 |
| | silver | 20.58 | 20.76 | 20.77 | 7 | 21 | 41 |
| | solder | 20.51 | 20.75 | 20.74 | 6 | 18 | 39 |
| Com. Ex. 2 | copper | 1.21 | 1.74 | 2.32 | 28 | 54 | 81 |
| | silver | 1.89 | 2.44 | 3.42 | 31 | 57 | 88 |
| | solder | 1.59 | 2.12 | 3.18 | 32 | 57 | 8 |

Note 1) Ex: Example
Note 2) Com. Ex: Comparative Example
Note 3) wk: week
Note 4) wks: weeks
Note 5) mo: month

TABLE 2

Changes with the Passage of Time in the Concentration of Reductive Gas in the Preservation Condition

| | | CO (%) | | $H_2$ (%) | | Hexane (%) | Butyraldehyde (%) |
|---|---|---|---|---|---|---|---|
| | Material | 1 wk. | 1 mo. | 1 wk. | 1 mo. | 1 mo. | 1 mo. |
| Ex. | copper | 0.32 | 0.41 | 0.24 | 0.25 | 0.02 | 5 |
| | silver | 0.31 | 0.38 | 0.25 | 0.27 | 0.03 | 4 |
| | solder | 0.34 | 0.39 | 0.22 | 0.24 | 0.03 | 5 |

TABLE 3

State of Discoloration of Preserved Test Pieces

| | | State of Discoloration | | | |
|---|---|---|---|---|---|
| | Material | Before preservation | 1 week | 2 weeks | 1 month |
| Ex. | copper | − | − | − | − |
| | silver | − | − | − | − |
| | solder | − | − | − | − |
| Com. Ex. 1 | copper | − | − | + | ++ |
| | silver | − | − | + | + |
| | solder | − | − | + | ++ |
| Com. Ex. 2 | copper | − | + | ++ | ++ |
| | silver | − | + | + | ++ |
| | solder | − | + | ++ | +++ |

Note: State of discoloration
−: no discoloration
+: distinguishable slight discoloration
++: substantial discoloration
+++: overall discoloration Solder Bonding Properties Test The test piece, which was accommodated in a hermetically sealed manner together with the rust-proof agent packet, was taken out of the bag and the bonding properties of solder were measured by the following method. However, with regard to the test piece gilded with copper, the thickness of the oxide layer over the metal copper surface was measured by an electrolytic reduction method.

Testing Method of Solder Bonding Properties (Meniscus Graph Method)

A flux R type (25% isopropanol solution of rosin, chlorine content: 27 ppm) was applied over the test piece in an application concentration of 55 g/m² with a brush, and the test piece was dried in hot air for 2 minutes at a temperature of 120° C. The solder bonding was performed on this test piece on the conditions subject to MIL-STD-883C 2022.10. The bonding properties of solder were evaluated by zero-cross time.

| 1. Measurement Device: made by RESUKA Kabushiki Kaisha SAT-5000 Type | |
|---|---|
| 2. Measuring Conditions | |
| Items | Conditions |
| Solder | JIS H63A (Sn63%) |
| Flux | R Type (rosin 25% IPA solution) |
| Temperature of Solder Bath | 245° C. |
| Dipping Time | 5 seconds |
| Dipping Depth | 2 mm |
| Dipping Speed | 25 mm/sec |

According to this testing method, when the test piece is dipped in the solder bath, buoyancy acts on the dipped test piece at first, and then the melted solder metal piles up above the test piece because of surface tension and the test piece looses buoyancy. The zero-cross time is the period of time that lapses between the beginning of the dipping and the time when the buoyancy is lost. The zero-cross time is measured automatically. Therefore, a reciprocal number of the zero-cross time indicates the piling-up speed of the melting solder metal. A smaller value of the zero-cross time indicates better bonding properties of solder with metal.

Analysis Method of Oxide Content

Measurement Principle: electrolytic reduction method

Measurement Device: made by HARIMA CHEMICALS, Ltd.,

BOARD-O-TESTER

Measurement Unit: The quantity of electricity required for the reduction of copper oxide to metal copper at the electric potential of $-800$ mV was converted into the thickness of $Cu_2O$ in the following expression, and the oxide content was obtained.

$$\delta = 71.5 \cdot i_p \cdot t / 96500.6$$

Figure 4:
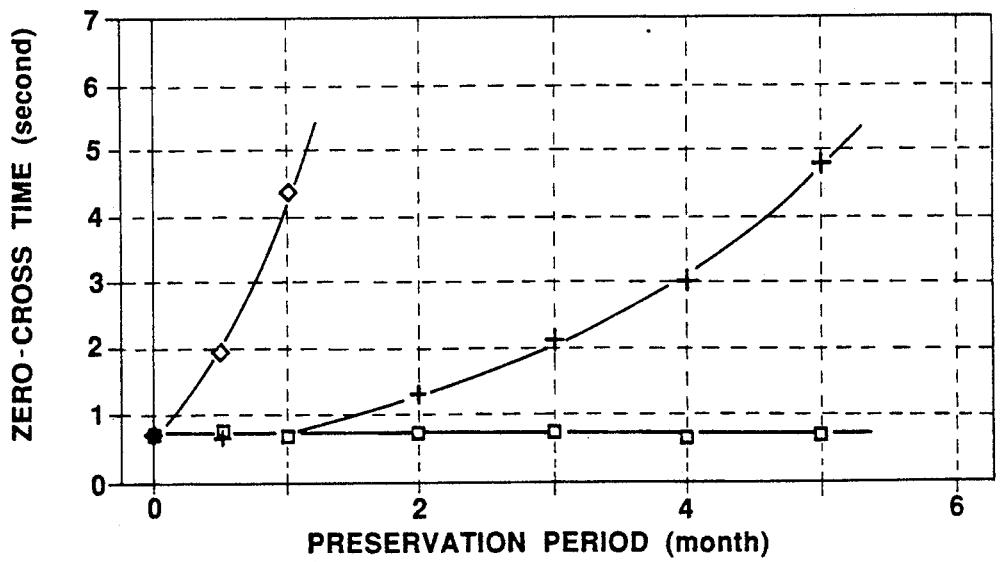
FIG. 4 shows the reservation period and the bonding properties of solder (zero-cross time) on the test pieces gilded with copper.
Figure 5:
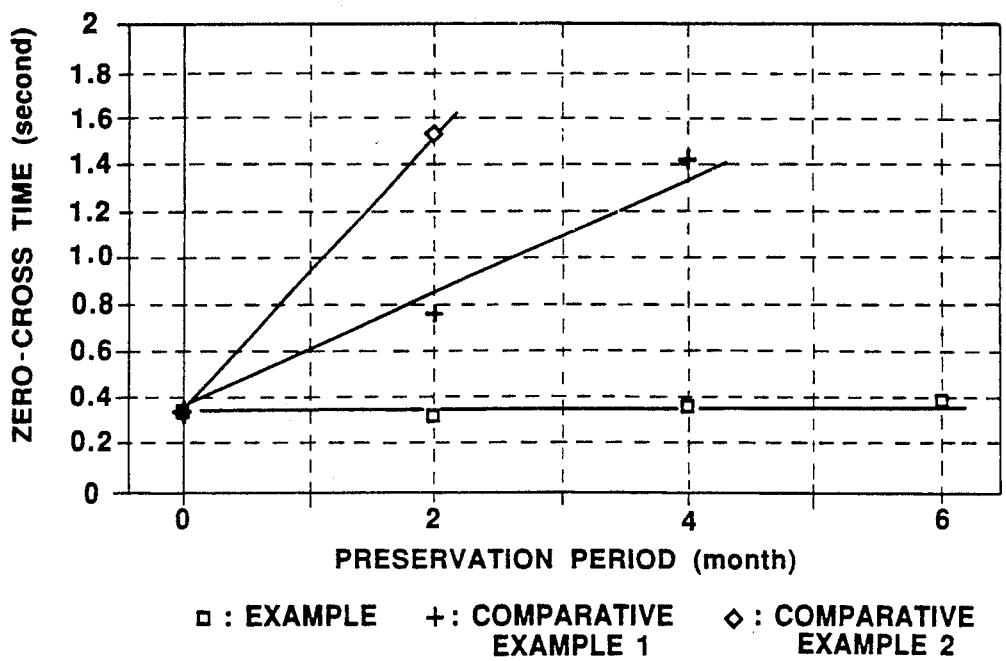
FIG. 5 shows the preservation period and the bonding properties of solder (zero-cross time) on the test pieces gilded with silver.
Figure 6:
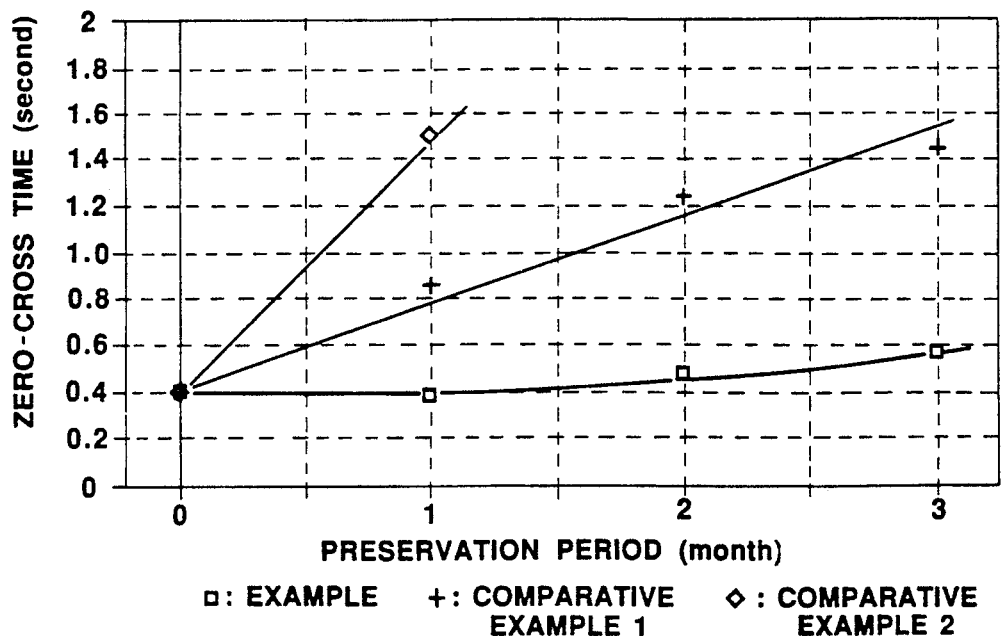
FIG. 6 shows the preservation period and the bonding properties of solder (zero-cross time) on the test pieces gilded with solder.

$\delta$ = thickness of oxide (nm)
$i_p$: current density (coulomb/second·cm²)
$t$: time (second)
test piece: $10 \times 60 \times 0.5$ mm FIGS. 4, 5 and 6 show the relationship between the preservation period and the bonding properties of solder (zero-cross time). Moreover, FIG. 4 shows the relationship between the thickness of the oxide layer and the bonding properties of solder with regard to the test piece gilded with copper at the time after gilding treatment before preservation and at the time one month after preservation.

TABLE 4

Thickness of Oxide Layer of the Test Piece Gilded with Copper before Preservation and One Month After Preservation

| | Before Preservation | Example | Com. Ex. 1 | Com. Ex. 2 |
|---|---|---|---|---|
| Thickness of Oxide layer (nm) | 49, 55 | 49, 55 | 496, 525 | 401, 547 |
| Zero-cross Time (second) | 0.4, 0.5 | 0.4, 0.5 | ∞, ∞ | ∞, ∞ |

Note
Thickness of Oxide layer: $Cu_2O$ conversion

COMPARATIVE EXAMPLE 1

Three kinds of test pieces gilded with copper, silver and solder were preserved in the same manner as in Example except that the content of the packet of the Example was changed to 3 g of silica gel (Type A) in order to make a packet of desiccant in the same procedure as in the Example.

COMPARATIVE EXAMPLE 2

Three kinds of test pieces respectively gilded with copper, silver and solder were accommodated in preservation bags of silicon dioxide deposited combined film together with 500 ml of nitrogen gas in a hermetically sealed manner as in the Example, however, without using an anticorrosive packet. In this case, since the air within the preservation bags could not be completely replaced with nitrogen gas, the oxygen content within the bags was 0.7% when sealed. The preservation bags containing these test pieces in a hermetically sealed manner were preserved in the same method as in the Example.

The test pieces preserved in Comparative Examples 1 and 2 were taken out of the bags, and the bonding properties of the solder were measured as in the Example. With regard to the test pieces gilded with copper, the thickness of the oxide layer over the surface of copper was measured by the electrolytic reduction method.

The results of Comparative Examples 1 and 2 are shown respectively in Table 1, Table 3, Table 4, FIG. 4, FIG. 5, and FIG. 6 together with the results of the Example. However, no reductive gas was detected in the preservation condition used in Comparative Examples 1 and 2.

The bonding properties of solder may be evaluated by zero-cross time. The zero-cross time varies depending on the types of metal, but it is preferable to have a shorter zero-cross time. As it is obvious from FIG. 4 (copper gilding), FIG. 5 (silver gilding) and FIG. 6 (solder gilding) which show the relationship between the preservation period and the bonding properties of solder (zero-cross time), the zero-cross times of the test pieces preserved in the method of the present invention, even if the preservation period is long, is the same as the zero-cross times immediately after gilding and the bonding properties of solder are extremely well maintained. On the contrary, in Comparative Examples 1 and 2, the zero-cross times of all the test pieces changed. Even in the case of Comparative Example 1 when the test pieces were accommodated in the bags in a hermetically sealed manner together with the desiccant, the bonding properties of solder deteriorates with the passage of time.

The reasons for good bonding properties of solder when using the method of the present invention will be considered hereafter. In the method of the present invention, as it is obvious in Tables 1 and 2, by accommodating a member including metal in a hermetically sealed manner together with a rust-proof agent packet in a gas-impermeable container, oxygen, moisture and corrosive substances in the preservation container are absorbed by the rust-proof agent, and reductive substances are generated due to oxygen absorption reaction of the main component of the rust-proof agent. Accordingly, we may consider that, in the method of the present invention, the preservation of the metal member under a reductive atmosphere where no oxygen, moisture or corrosive substances actually exist, and where reductive gas co-exists with the metal member, prevents the formation of an oxide layer over the metal surface which is to be bonded by solder, and that reduction of the oxide enables the maintenance of good bonding properties of solder. The reduction occurring in the oxide over the metal surface is confirmed by, for example, a change in the charge of copper oxide from copper(II) to copper(I) over the metal copper surface of the test pieces gilded with copper.

According to the present invention, the oxidation of a metal surface may be inhibited and good bonding properties of solder may be maintained by accommodating a member including metal, which is the object of solder bonding, in a gas-impermeable container in a hermetically sealed manner together with a rust-proof agent packet. As a result, good bonding properties of solder may be realized even using a postflux containing a small amount of halogen. Especially in the field of electronic materials, since the use of the postflux containing a small amount of halogen allows the amount of the remaining halogen to be kept to an extremely small amount, it is unnecessary to give a cleaning treatment using organic halogen-based solvents or water containing surface active agents, the cleaning steps may be simplified, and cost reduction may be promoted. Moreover, the present invention will not add to environmental pollution due to organic halogen-based solvents and will contribute to the preservation of the global environment.

In other words, the method of the present invention enables preservation or transportation of the member including metal by retaining it under a reductive atmosphere where no oxygen, moisture or corrosive substances exist and where reductive gas co-exists with the material, by an extremely simple method at a low cost and without loosing the bonding properties of solder. Accordingly, the use of the postflux containing a small amount of halogen easily allows the solder bonding.

What is claimed is:

1. A method of bonding a metal by solder, which method comprises the steps of:
   applying a flux containing a small amount of halogen compounds over the portion, which is to be bonded by solder, of a member including metal which is preserved in a gas-impermeable container together with a rust-proof agent which absorbs substances that oxidize metals; and
   bonding by solder the portion on which the flux is applied.

2. A method according to claim 1, wherein said rust-proof agent is wrapped with a gas-permeable packing material.

3. A method according to claim 1, wherein the amount of halogen compounds contained in said flux is 0.2 wt. % or less as the amount of halogen.

4. A method according to claim 1, wherein said metal is at least one of copper, silver, iron, zinc, lead, tin, nickel or gold.

5. A method according to claim 1, wherein said member is an electronic member used in the electronic field.

6. A method according to claim 2, wherein said rust-proof agent is an oxygen absorbing agent which absorbs oxygen in a dry condition.

7. A method according to claim 1, wherein said rust-proof agent absorbs oxygen, moisture and corrosive substances within the container.

8. A method according to claim 1, wherein the oxygen content within the container is 0.5% or less.

9. A method according to claim 1, wherein said rust-proof agent removes the substances oxidizing metals out of the container within a few hours and also removes the substances oxidizing metals which permeate through the container.

10. A method according to claim 1, wherein the period of time that is necessary for the rust-proof agent to absorb oxygen within the container until it reaches a state of no oxygen, is adjusted to be within a range from 2 hours to 5 days.

11. A method according to claim 1, wherein said rust-proof agent comprises an unsaturated fatty acid compound as a main component, an oxidation promoting substance, which functions as a catalyst of the oxygen absorption reaction by the main component, a basic substance, and an absorption substance which absorbs moisture.

12. A method according to claim 11, wherein said rust-proof agent further comprises a hydrocarbon compound including unsaturated groups as a main component.

13. A method according to claim 12, wherein said hydrocarbon compound is a polymer of monomers which consist of hydrocarbon chains.

14. A method according to claim 11, wherein said unsaturated fatty acid compound is at least one of unsaturated fatty acid, ester thereof and salt thereof.

15. A method according to claim 14, wherein said salt of unsaturated fatty acid is a transition metal salt.

16. A method according to claim 11, wherein said oxidation promoting substance is a transition metal salt.

17. A method according to claim 11, wherein said basic substance is at least one of alkali metal salt, alkaline earth metal salt, organic acid salt and organic amines.

18. A method according to claim 12, wherein said absorption substance further absorbs acid substances and holds the main component of the rust-proof agent.

19. A method according to claim 12, wherein the content of respective components of the rust-proof agent is 0.01 to 10 parts by weight of the oxidation promoting substance, 1 to 1000 parts by weight of the basic substance, and 10 to 1000 parts by weight of the absorption substance against 100 parts by weight of the main component.

20. A method according to claim 2, wherein the gas permeability of said packing material is 1000 ml/m$^2$·atm·Day or more of the oxygen permeation speed.

21. A method according to claim 1, wherein said gas-impermeable container has an oxygen permeation speed of 5 ml/Day or less per volume 100 ml and has a moisture permeation speed of 5 g/Day or less per volume 100 ml.

22. A method according to claim 1, wherein the applied amount of flux is 10 to 1000 g/m$^2$.

23. A method according to claim 1, wherein the member including metal is preserved under an atmosphere where reductive gas co-exists within the container.

24. A method according to claim 23, wherein said rust-proof agent generates reductive gas by oxygen absorption.

25. A method according to claim 1, wherein said rust-proof agent absorbs substances that oxidize metal in a dry condition.

26. A method according to claim 1, wherein said member is a metal material.

* * * * *